US012615852B2

(12) United States Patent
Blankemeyer et al.

(10) Patent No.: US 12,615,852 B2
(45) Date of Patent: Apr. 28, 2026

(54) SOLAR MODULE WITH OPTIMIZED INTERCONNECTION AND METHOD OF MANUFACTURING THE SAME

(71) Applicant: INSTITUT FÜR SOLARENERGIEFORSCHUNG GMBH, Emmerthal (DE)

(72) Inventors: Susanne Blankemeyer, Bad Pyrmont (DE); Henning Schulte-Huxel, Hannover (DE); Marc Köntges, Hameln (DE); Thomas Daschinger, Emmerthal (DE)

(73) Assignee: INSTITUT FÜR SOLARENERGIEFORSCHUNG GMBH, Emmerthal (DE)

( * ) Notice: Subject to any disclaimer, the term of this patent is extended or adjusted under 35 U.S.C. 154(b) by 27 days.

(21) Appl. No.: 18/566,313

(22) PCT Filed: May 24, 2022

(86) PCT No.: PCT/EP2022/064014
§ 371 (c)(1),
(2) Date: Dec. 1, 2023

(87) PCT Pub. No.: WO2022/258361
PCT Pub. Date: Dec. 15, 2022

(65) Prior Publication Data
US 2024/0363780 A1    Oct. 31, 2024

(30) Foreign Application Priority Data
Jun. 9, 2021    (DE) ..................... 10 2021 114 906.1

(51) Int. Cl.
H10F 19/90        (2025.01)
H10F 77/00        (2025.01)
(Continued)

(52) U.S. Cl.
CPC ......... *H10F 19/904* (2025.01); *H10F 77/215* (2025.01); *H10F 77/937* (2025.01); *H10F 19/35* (2025.01)

(58) Field of Classification Search
None
See application file for complete search history.

(56) References Cited

U.S. PATENT DOCUMENTS 7,432,438 B2    10/2008  Rubin et al.
8,951,824 B1     2/2015  Krajewski
(Continued)

FOREIGN PATENT DOCUMENTS

CN        108365041  A    8/2018
EP          1547158  B1   11/2007
(Continued)

OTHER PUBLICATIONS

Machine translation of KR 101788160 B1 (Year: 2017).*
(Continued)

*Primary Examiner* — Tamir Ayad
(74) *Attorney, Agent, or Firm* — Maier & Maier, PLLC

(57)        ABSTRACT

A solar module and a method of manufacturing the same. The solar module has a plurality of solar cell arrays, a cross-connector and an encapsulation. Each of the solar cell arrays includes solar cell substrates with contact structures and an interconnection structure that includes a plurality of round or rounded wires. Some of the wires have a flatter cross-section in a flattened region than the same wires in a non-flattened region adjacent to the flattened region and/or than other wires. The flattened region is located at and/or near an edge of a terminal solar cell substrate adjacent to a portion of the contacting surface of a rear side of the solar (Continued)

cell substrate. At least two strings of solar cell arrays are arranged side by side and interconnected by means of the cross-connector.

7 Claims, 4 Drawing Sheets

(51) Int. Cl.
  *H10F 77/20* (2025.01)
  *H10F 19/35* (2025.01)

(56) References Cited

U.S. PATENT DOCUMENTS

| | | |
|---|---|---|
| 2011/0174354 A1 | 7/2011 | Kutzer et al. |
| 2011/0197947 A1 | 8/2011 | Croft |
| 2012/0027994 A1 | 2/2012 | Takada et al. |
| 2012/0103383 A1 | 5/2012 | Shufflebotham |
| 2017/0104121 A1 | 4/2017 | O'Neill et al. |
| 2019/0296172 A1 | 9/2019 | Kang et al. |
| 2020/0144434 A1 | 5/2020 | Kim |

FOREIGN PATENT DOCUMENTS

| | | |
|---|---|---|
| EP | 2947700 A1 | 11/2015 |
| EP | 3165361 A1 | 5/2017 |
| EP | 3389099 A1 | 10/2018 |
| EP | 3046151 B1 | 4/2019 |
| JP | 2009141264 A | 6/2009 |
| JP | 2012009681 A | 1/2012 |
| JP | 2012054286 A | 3/2012 |
| KR | 101788160 B1 | 11/2017 |
| WO | 2011020205 A1 | 2/2011 |
| WO | 2015001413 A1 | 1/2015 |
| WO | 2018/225005 A1 | 12/2018 |
| WO | 2019/016118 A1 | 1/2019 |
| WO | 2020/008358 A1 | 1/2020 |
| WO | 2020/039381 A1 | 2/2020 |

OTHER PUBLICATIONS

International Search Report issued on Sep. 9, 2022 in corresponding application No. PCT/EP2022/064014; 4 pages.
[Augusto2016] A. Augusto, K. Tyler, S. Y. Herasimenka, and S. G. Bowden, "Series Connection Front-to-Front and Back-to-Back of Silicon Heterojunction Solar Cells," in 2016, IEEE 43rd Photovoltaic Specialists Conference (PVSC), 2016, pp. 2631-2634, 4 pages.
[Despeisse 14] M. Despeisse, A. Faes, J. Levrat, J. Champliaud, N. Badel, M. Kiaee, T. Söderström, Y. Yao, R. Grischke, M. Gragert, J. Ufheil, P. Papet, B. Strahm, G. Cattaneo, J. Gattin, Y. Baumgartner, A. Hessler-Wyser, C. Ballif, SmartWire solar cell interconnection technology, 6th World Conference on Photovoltaic Energy Conversion, Nov. 23-27, 2014, Kyoto, Japan, 7 pages.
[Kopecek2006] R. Kopecek et al., "Module Interconnection With Alternate P- and Ntype Si Solar Cells," in EUPVSEC, Sep. 4-8, 2006, Dresden, Germany, 2006, pp. 111-115, 5 pages.
[Schulte-Huxel2016] H. Schulte-Huxel et al., "Flip-Flop Cell Interconnection Enabled by an Extremely High Bifacial Factor of Screen-Printed Ion Implanted N-PERT Si Solar Cells," in 32nd European Photovoltaic Solar Energy Conference, 2016, pp. 407-412., 6 pages.

* cited by examiner

SOLAR MODULE WITH OPTIMIZED INTERCONNECTION AND METHOD OF MANUFACTURING THE SAME

FIELD

The present invention relates to a solar module with optimized interconnection and a method of manufacturing the same.

BACKGROUND

Solar cells are used to convert light directly into electrical energy using the photovoltaic effect. For this purpose, a solar cell has a solar cell substrate with a semiconductor substrate and contact structures disposed thereon. In the semiconductor substrate, absorbed light generates charge carrier pairs which are separated spatially and at different energy levels and which are then fed via contact structures to an external consumer to supply it with electrical power.

Generally, a large number of solar cells are interconnected and together embedded in an encapsulation to form a solar module. The conventional approach is to connect individual solar cells in series using cell connectors in the form of metal strips or wires to form so-called strings. The solar cells of a string can be arranged in a line side by side. A plurality of such strings can then be connected together in series and/or in parallel. For this purpose, for example, adjacent strings can be electrically connected to each other with the aid of cross-connectors, again in the form of metal strips.

The aim is always to convert incident light into electrical power as efficiently as possible with solar modules. Various factors influence a solar module's efficiency.

For example, the individual solar cell substrates should be able to absorb as much light as possible and convert it into electrical power as efficiently as possible. Particular efforts may be directed towards ensuring that as few regions as possible of a surface of the semiconductor substrate facing the incident light are shaded by the contact structures and cell connectors. In conventional solar modules, cell connectors are often of considerable width to avoid high electrical series resistance, and this can lead to significant shading of incident light. To avoid associated efficiency losses and nevertheless prevent electrical losses due to increased series resistance within the solar cell contacts, approaches have been developed wherein adjacent solar cells in a string are connected to each other not by one or a small number of wide cell connectors, but by a large number of narrow wires. Such an approach is sometimes known as multi-busbar technology or SmartWire® technology and is described, for example, in U.S. Pat. No. 7,432,438 A1.

As a further factor influencing the efficiency of a solar module, the solar module should be covered with solar cell substrates over as large an area as possible. In other words, parts in which, for example, cross-connectors run and in which no solar cell substrates are disposed and thus no conversion of light into electrical energy can take place should account for as small a proportion of the solar module's area as possible.

Many conventional approaches are known for achieving maximum efficiencies in solar modules. Examples are described in, among others, US 2011/0197947 A1, US 2012/0103383 A1, US 2012/027994 A1, WO 2011/020205 A1, US 2011/0174354 A1, U.S. Pat. No. 8,951,824 B1, WO 2015/001413 A1, EP 2 947 700 A1, CN 108365041 A and WO 2015/001413 A1.

JP 2012-009681 A, JP 2009-141264 A, and JP 2012-054286 A each describe a solar cell module and methods of manufacturing a solar cell module. US 2019/0296172 A1 describes a connecting element for a solar cell panel. US 2017/0104121 A1 describes a light redirecting film that can be used in a solar module.

SUMMARY

There may be a need for a solar module equipped with multiple solar cell arrays, which on the one hand allows for high efficiency of the solar module and on the other hand allow for easy and/or reliable manufacturing or high durability and/or reliability of the solar module. There may also be a need for a method of manufacturing such a solar module.

The said requirements can be fulfilled, at least in part, with the subject-matter of one of the independent claims of the present application. Advantageous embodiments are indicated in the dependent claims and the following description.

According to a first aspect of the present invention, a solar module is described.

According to a second aspect of the present invention, a method of manufacturing a solar module is described.

Embodiments of the invention may be considered, inter alia and without limiting the invention, as being based on ideas or findings described below:

By way of introduction, a basic idea concerning embodiments of the invention described herein will be briefly explained, this explanation to be interpreted as merely roughly summarizing and not limiting the invention:

As mentioned in the introduction, the aim is to optimize the efficiency of a solar module by, among other things, using a large number of narrow wires to interconnect adjacent solar cell substrates instead of a few wide cell connectors as part of a multi-busbar concept. Adjacent solar cell substrates are each connected in series with a plurality of wires belonging to a first plurality of wires of an interconnection structure to form a string. The wires run along a first contacting surface of a first solar cell substrate and contact and connect the contact structures located there. The wires then extend further to a second contacting surface of an adjacent second solar cell substrate and contact and connect the contact structures located there. The first contacting surface and the second contacting surface may have opposite polarities. Consequently, the two adjacent solar cell substrates or a plurality of such adjacent solar cell substrates are connected in series to form a string by means of the wires.

At a terminal solar cell substrate, that is to say, at an outermost solar cell substrate which is located at one end of such a first string and which, in contrast to solar cell substrates within the string, has only one solar cell substrate directly adjacent to it, the contact structures provided there at a contacting surface are contacted and interconnected by means of a plurality of wires belonging to a second plurality of wires of the interconnection structure.

These wires of the second plurality of wires shall then be connected within the solar module via a cross-connector to the wires on a terminal solar cell substrate of a second string of solar cell substrates adjacent to the first string. To avoid having to keep areas within the solar module clear exclusively for the cross-connector, the aim here is not to arrange the cross-connector laterally next to the respective terminal solar cell substrates, as is usually the case. Instead, it is proposed to have the cross-connector extend along a rear side of the solar cell substrates, that is to say, adjacent to an active surface of the solar cell substrates facing away from the light to be absorbed. For cell faces active on both sides, one of the two cell faces, preferably that with the lower light-to-current efficiency, can be chosen as the rear side.

It has however been observed that solar cell substrates are more likely to be damaged when interconnecting the solar cell substrates or when subsequently embedding the solar cell substrates in the encapsulation of the solar module.

Such damage presumably results from point loads or linear loads, such as may be provoked in particular by the cross-connector when it presses on parts of the wires that touch the contacting surface of a solar cell substrate.

It is therefore proposed that a region of the wires of the second plurality of wires contacting the terminal solar cell substrate of a string be flattened. The flattening can cause the wires in the flattened region to contact the contacting surface of the adjacent solar cell substrate in a planar rather than a linear fashion. This makes it possible to avoid local mechanical overloads on the solar cell substrate and thus damage to this solar cell substrate, for example due to cracks or fractures.

However, adjacent to the flattened regions, that is to say, in particular where the wires in the solar module are not normally loaded by a cross-connector running above them, the wires need not and should not be flattened, but retain their original high, in particular preferably circular cross-section, in order to, for example, minimize shading losses due to the wires.

Possible embodiments and advantages of embodiments of the proposed solar module, including solar cell arrays incorporated therein, and methods of manufacturing the same, are described in more detail below:

The term solar cell array may here be understood to refer to a string consisting of a plurality of interconnected solar cell substrates. The solar cell substrates are generally connected in series with each other. Adjacent solar cell substrates are each electrically connected to one another by means of a plurality of thin wires, referred to herein as a first plurality of wires. A contacting surface with a first polarity is connected to a contacting surface with a second polarity of an adjacent solar cell substrate.

Each of the solar cell substrates has a planar geometry. For example, a solar cell substrate may have lateral dimensions typically ranging from 125×125 mm$^2$ to typically 210×210 mm$^2$ and a substrate thickness typically in the range of 100 μm-300 μm. In particular for interconnection in the solar module, it is common practice to divide solar cell substrates with dimensions from 166×166 mm$^2$ into halves or, in the case of even larger solar cell substrates, for example from 210×210 mm$^2$, into thirds in order to avoid or reduce electrical resistance losses when collecting the current on the solar cell substrate surface. A solar cell substrate is understood to be a combination of a semiconductor substrate and contact structures disposed on a contacting surface of this semiconductor substrate. The semiconductor substrate can be, for example, a silicon substrate, especially a silicon wafer. The semiconductor substrate may be brittle and fragile. Differently doped regions, in particular oppositely p-and n-doped regions, may be formed in the semiconductor substrate to form a p-n junction.

The contact structures may be located directly adjacent to the contacting surface of the semiconductor substrate. Typically, the contact structures are permanently connected to the semiconductor substrate and are already produced during the manufacture of the solar cell substrate, that is to say, not only during subsequent interconnection to form strings. The contact structures can be metallic, for example. The contact structures may be elongated, in particular linear. Alternatively, the contact structures may have other geometries, such as wave-shaped, zigzag, as multiple contact pads arranged one after the other, or similar. Adjacent contact structures can run parallel to each other. The contact structures may form a contact grid with a plurality of parallel contact fingers running parallel to each other, for example, at intervals typically between 1 mm and 5 mm. The contact structures can, for example, be printed onto the contacting surface, for example by screen printing of pastes containing metal particles. Planar transparent contacts made of transparent highly conductive semiconductors are also possible.

The interconnection structure is formed by a plurality of wires. The wires preferably have a very small width compared to their length. For example, a wire's length may approximately correspond to a sum of dimensions of the solar cell substrates to be interconnected using the wire, the dimensions of the solar cell substrates being measured in a direction parallel to a direction in which the wire extends. The length may, for example, be more than 70 mm, preferably less than 220 mm. The wire's width may typically be between 150 μm and 450 μm. The wires may preferably have a round cross-section in regions where they are not specifically flattened. In other words, the wires can be round wires at least prior to targeted local flattening. The wires can be made of a material with good electrical conductivity, in particular a metal material, for example copper, aluminum, silver, or the like, or alloys or mixtures thereof. The wires can extend linearly and/or parallel to each other along the respective contacting surface to be contacted. Adjacent wires can run parallel to each other. Adjacent wires can be at a lateral distance from each other that is typically significantly greater than a lateral distance between adjacent contact structures. For example, the lateral distance can be between 2 mm and 50 mm, preferably between 5 mm and 30 mm. Where the contact structures are elongated, the wires preferably run transversely, in particular preferably perpendicularly, to a direction in which the contact structures extend. In this case, the wires preferably contact the contact structures at contact locations both mechanically and electrically. The wires can merely touch the contact structures or be bonded to them, for example soldered.

Multiple wires of a first plurality of wires are used to electrically interconnect adjacent solar cell substrates. Except for the two terminal solar cell substrates at the opposite ends of a string, each of the solar cell substrates has two solar cell substrates lying nearest to it, that is, a first nearest solar cell substrate adjacent to a first edge of the solar cell substrate and a second nearest solar cell substrate adjacent to a second edge of the solar cell substrate opposite the first edge. For example, the wires may extend along a contacting surface on a front side of a first solar cell substrate and along a contacting surface on a rear side of an adjacent second solar cell substrate. The two solar cell substrates may be placed side by side at a small distance from each other, allowing the wires to pass between the two solar cell substrates through a gap located there. Alternatively, the two solar cell substrates may be arranged to overlap each other, for example in a shingle type arrangement.

Multiple wires of a second plurality of wires are used to electrically interconnect the contacting structures at the contacting surface of one of the terminal solar cell substrates in a string. Here, the wires of the second plurality of wires each contact only the terminal solar cell substrate, that is to say, only a single solar cell substrate, in contrast to the wires of the first plurality of wires, each of which contacts at least two adjacent solar cell substrates. In other words, the wires of the second plurality of wires generally have mechanical contact exclusively with the terminal solar cell substrate, but do not have mechanical contact with an adjacent solar cell substrate. Thus, the wires of the second plurality of wires are generally significantly shorter than the wires of the first plurality of wires, in particular roughly half as long. Otherwise, the wires of the first plurality and the second plurality of wires can be identically formed at least before a local deformation described below, in particular having an identical, preferably round cross-section.

The wires of the second plurality of wires have a region in which they have a flatter cross-section than in an adjacent region or than the wires of the first plurality of wires. This region is referred to herein as the flattened region, as it may preferably be formed by selectively flattening, that is to say, pressing flat, a wire having an originally greater cross-section locally in the said region. Thus, the cross-sectional area of the wire is substantially the same in the flattened region as in a non-flattened region, but is distributed over a greater width and a lower height than in the non-flattened region. The flattened region may be a portion of a wire of the second plurality of wires, and a non-flattened region may be present adjacent to the flattened region of the same wire. The flattened region of a wire can preferably be significantly shorter than the non-flattened region of the same wire. The flattened regions of adjacent wires of the second plurality of wires may each be arranged adjacent to one another in a reference direction transverse to the longitudinal direction of the wires, that is to say, each of these wires may be flattened with respect to its longitudinal extent in an equal portion spaced from an end of the wire. In principle it is also conceivable that all wire of the second plurality of wires is flattened, meaning that the flattened region extends along the entire length of the wire of the second plurality of wires. Preferably, all of the wires of the second plurality of wires are provided with a flattened region.

One reason for providing the flattened region is that, in a solar module constructed from a plurality of the described solar cell arrays, cross-connectors interconnecting adjacent strings can be arranged in the flattened region. The cross-connectors can, for example, take the form of strips or thicker wires and have a height of, for example, 100 μm to 600 μm. It is endeavored to arrange these cross-connectors not laterally next to the terminal solar cell substrate, but in an orthogonal direction to the contacting surface adjacent to the solar cell substrate, so usually behind the rear side of the solar cell substrate. A cross-connector thus extends across the wires of the second plurality of wires running there. Particularly when encapsulating the solar cell substrates, the interconnection structure and the cross-connectors in an encapsulation, considerable pressures of, for example, up to 1 bar can act in particular on the cross-connectors. It has been observed that solar modules in which the cross-connectors run across conventional round wires on the rear side of solar cell substrates are more likely to suffer damage, for example, in the form of localized fractures or cracks on some solar cell substrates. This damage is presumably caused by high local loads exerted by the cross-connectors on the round wires and, by these along a very narrow, linear contact surface, on the underlying solar cell substrates. Based on this observation and the aforementioned assumption, it is therefore proposed to selectively flatten the wires of the second plurality of wires at least in a region where the cross-connectors are to be arranged over them in the solar modules being manufactured. This flattening can, among other things, increase the contact area between a wire and the underlying solar cell substrate, in particular widen it, and thus reduce pressures transmitted locally by the cross-connector. This can significantly reduce a risk of damage, especially when interconnecting adjacent strings with the cross-connectors or during subsequent embedding in an encapsulation.

The flattened region is located at and/or near an edge of the terminal solar cell substrate.

In other words, the flattened region may constitute only a portion of one of the wires of the second plurality of wires and may be arranged at or near an edge of the associated solar cell substrate. The flattened region is closer to the edge than to a geometric center of the solar cell substrate. For example, the flattened region preferably extends adjacently to a portion of the contacting surface of the rear side of the terminal solar cell substrate, the portion constituting not more than one third, preferably less than 10%, of the total contacting surface, and/or the distance of the portion from the edge of the terminal solar cell substrate being less than 30%, preferably less than 10%, of the width of the contacting surface measured in the longitudinal direction of extension of the wires. Specifically, the flattened region may be, for example, a maximum of 20 mm, preferably a maximum of 10 mm, from the edge of the terminal solar cell substrate.

According to one embodiment, the flattened region of the wires of the second plurality of wires is disposed at and/or near an edge of the terminal solar cell substrate facing away from an adjacent solar cell substrate, the terminal solar cell substrate having only one adjacent solar cell substrate.

In other words, the flattened regions may preferably be disposed at or near an outer border of the solar cell array, said border being formed by an edge of the terminal solar cell substrate facing away from a rest of the string.

Due to the positioning of the flattened region chosen for the two embodiments described above, advantages can be obtained for the solar module to be manufactured. In particular, cross-connectors can be advantageously arranged later on in the solar module to be manufactured. For example, with cross-connectors arranged in this way, low series resistances for the solar module and/or simple and reliable production of the same can be achieved. Furthermore, adjacent cross-connectors can be arranged in parallel offset to each other on the solar cell substrate. These cross-connectors usually have to be led out at a point in the solar module from the laminate or encapsulation into a contact box. If these cross-connectors were arranged exactly in a line, they would collide with each other at the point where they are led out of the laminate to the box. If the cross-connectors on the terminal solar cell substrates are offset by their width plus a safety distance of, for example, 1 mm to 10 mm, the cross-connectors can be led out of the laminate without colliding with each other. If this method were used as normal above the terminal solar cell substrates, the solar module would have to have a greater area that is not electrically active due to solar cell substrates.

According to one embodiment, a height of the wires measured in an orthogonal direction orthogonally to the contacting surface is at least 10%, preferably at least 30%, smaller in the flattened region than in the non-flattened region.

In other words, the wires can be at least 10% or even at least 30% flatter in their flattened region than in a non-flattened region. Consequently, the wires may also be at least 10% or even at least 30% wider in their flattened region than in a non-flattened region. A contact surface between the wire and the adjacent solar cell substrate can thus be correspondingly larger in the flattened region than in the non-flattened region. Forces exerted on the wire, for example by a cross-connector, can thus result in reduced local pressures on the solar cell substrate. The height of the wires in the flattened region should preferably be no more than 60%, more preferably no more than 40%, smaller than in the non-flattened region.

According to one embodiment, the wires in the flattened region have a planar surface at least on a side facing towards the solar cell substrate.

In the non-flattened region or before a targeted flattening, the wire typically has a round or rounded cross-section. Consequently, a lateral surface, that is to say, a circumferential surface, of the wire is curved. The non-flattened region of the wire is thus in contact with the generally flat contacting surface of the solar cell substrate or with contact structures located having only a quasi-linear or quasi-point contact surface.

In order to increase the contact surface and thus reduce the pressures existing there, the wire can be specifically deformed in the flattened region in such a way that at least part of its circumferential surface, particularly that part of the circumferential surface which faces the solar cell substrate, is essentially flat. Here, the planar surface of the flattened region is preferably substantially parallel to the contacting surface of the solar cell substrate. For example, the wire can be compressed with a type of press or pliers in the region to be flattened, and deformed in such a way that at least part of the circumferential surface is pressed flat, that is to say, made planar.

According to one embodiment, a length of the flattened region is less than the width of the solar cell along which the wire runs, preferably less than the width by approx. 20 to 6 mm, and preferably greater than 3 mm.

Alternatively or additionally, a length of the flattened region measured in a longitudinal direction of the wires may be less than 10%, preferably less than 5% or less than 3%, of a dimension of the outermost solar cell substrate in the longitudinal direction of the wires.

In other words, preferably only a very small portion of the wire is flattened, whereas the majority of the wire can remain unflattened. In particular, it may be sufficient to form the flattened region in such a way that its length is approximately equal to the width of the cross-connector to be arranged across the flattened region or is only slightly longer than this width. Consequently, it may be sufficient to form the flattened region with a length typically between 1 mm and 50 mm, preferably between 3 mm and 20 mm. By flattening only a short region of the wire, the flattening process can be carried out easily and with relatively little force.

The wires have a round or rounded cross-section in the non-flattened regions.

Wires with a round or rounded cross-section, also known as round wires, can be produced very easily and inexpensively. Furthermore, due to their rotationally symmetrical cross-section, there is no risk of them being arranged with an incorrect cross-sectional orientation or, for example, twisted on the contacting surface of the solar cell substrate. The term "round" should not be understood in an absolutely strict geometrical sense, but may also include minor tolerances. For example, radiuses in different radial directions can vary within a tolerance range of, for example, ±20% or ±10%. The term "round" still covers minor local notches, flattenings, ovalizations or similar, such as may occur due to the manufacturing process, provided they only alter the circular cross-sectional contour to an insignificant degree.

According to one embodiment, the contact structures are thickened and/or a widened in a region where the contact structures are adjacent to a flattened region of one of the wires.

In other words, the contact structures provided on the contacting surface may be thicker and/or wider where they are covered by a flattened region of an adjacent wire than at other locations where corresponding contact structures are covered by a non-flattened region of an adjacent wire.

The contact structures can be configured as continuous contact fingers where they are covered by a flattened region of a wire. By means of such contact fingers, electric current generated in the solar cell substrate in an area underneath the flattened region of the wire can be conducted in the lateral direction toward a position where the wire contacts the contact structure with a non-flattened region.

According to one embodiment, the wires are each held on a film that covers the wires on a side opposite the solar cell substrate.

In other words, some or all of the wires laid along the contacting surface of one of the solar cell substrates can be held by a common film. The film can thus serve as a carrier film for the wires. The film can cover the wires along their entire length. Alternatively, particularly in the case of the wires of the second plurality of wires, the film may have openings adjacent to their flattened regions, so that the flattened regions are not covered by the film but can be exposed to the outside. The film can be a plastic film, in particular a polymer film. The wires can be fixed stationary onto the film, that is to say, for example, running parallel to each other. The film holds the wires on a side opposite to the side with which the wires are to contact the contacting surface of the solar cell substrate. The film and wires may be configured in the same or a similar manner to that described in U.S. Pat. No. 7,432,438 A1. Consequently, the wires together with the film can be easily handled and precisely positioned on the contacting surface of the solar cell substrate.

A solar module according to the first aspect of the invention can be constructed using previously described embodiments of multiple solar cell arrays. At least two strings of solar cell arrays are arranged side by side, that is to say, preferably with their longitudinal directions of extension running parallel to each other. The two strings are interconnected, that is to say, electrically connected to each other in series or in parallel, with the aid of at least one cross-connector. The cross-connector can be, for example, a wire or a strip made of a metal with good electrical conductivity, in particular copper, aluminum, silver or a mixture or alloy thereof. The cross-connector typically has a significantly larger cross-section and, in particular, a significantly greater height than the wires of the interconnection structure of the solar cell array, since the whole of the electrical current carried by a plurality of wires must be collectively conducted to the adjacent solar cell array via the cross-connector.

The proposed solar module differs from conventional modules in particular in that its solar cell arrays include the flattened region of the wires of the second plurality of wires and that cross-connectors are configured to overlap these flattened regions.

In other words, a cross-connector which connects the respective terminal solar cell substrates of two adjacent solar cell arrays to one another is preferably arranged on a rear side of the solar cell substrates facing away from the incident light and runs across the wires running on this rear side of the respective interconnection structures on the two solar cell substrates. To ensure that mechanical pressures exerted by the cross-connector on the solar cell substrates via the wires do not become excessive, in the worst case causing damage to the solar cell substrates, the flattened region is provided on the wires and the cross-connector is disposed so that it preferably contacts the wires only in this flattened region.

The entirety of the solar cell arrays, including their solar cell substrates, interconnection structures and cross-connectors, is embedded in an encapsulation during the manufacture of a solar module. The encapsulation preferably hermetically encloses all these components and thus protects them from mechanical and chemical influences. The encapsulation can be made of a plastic, in particular EVA (ethylene vinyl acetate), for example.

During the encapsulation process, relatively high pressures are typically exerted on the encapsulation material, including the components contained therein. Consequently, the cross-connector applies mechanical pressure to the flattened region of the second plurality of wires at least during this encapsulation process, but usually also in the completed solar module. However, due to the flattening of the wires in the flattened region, this pressure can be kept reduced at non-critical levels.

The cross-connector directly contacts the wires in the flattened region.

That is to say, the cross-connector and the wires of the interconnection structure to be contacted by it can be configured and disposed in such a way that the cross-connector in the finished solar module is in direct mechanical contact with the wires in their flattened regions. In other words, preferably no other component such as a film lies between the cross-connector and the wires. If the wires are held by a film in other regions, this film may have an opening at least adjacent to the flattened regions of the wires or may be locally removed so that the wires are exposed there and can contact the cross-connector directly.

When manufacturing a solar cell array, the solar cell substrates and the interconnection structure may be provided or formed in a manner as described in detail herein. The solar cell arrays may then be suitably arranged and interconnected and finally encapsulated in the course of manufacture of a solar module in accordance with the second aspect of the invention.

According to one embodiment, the wires of the second plurality of wires may preferably be flattened by mechanical deformation in the flattened region prior to arranging the wires on the terminal solar cell substrate. For this purpose, the wires can be deformed so as to flatten them, for example, by exerting sufficiently high pressures on their circumferential surface. Preferably, all wires of the second plurality of wires can be flattened in a common work process.

It is noted that possible advantages and embodiments of the invention are described herein partly with reference to a solar cell array according to the invention, a solar module according to the invention, a method of manufacturing a solar cell array or a method of manufacturing a solar module. A person skilled in the art will recognize that the described features may be suitably transferred, adapted, interchanged or modified to arrive at further embodiments of the invention.

BRIEF DESCRIPTION OF DRAWINGS

Embodiments of the invention are described below with reference to the accompanying drawings, in which neither the drawings nor the description are to be construed as limiting the invention.

The figures are merely schematic and not to scale. In particular, it is pointed out that the dimensions of, for example, the wires, contact structures, etc. shown in the figures are not reproduced realistically, but are merely intended to illustrate basic principles. Identical reference signs in the different figures denote identical or identically acting features.

DETAILED DESCRIPTION

Figure 1:
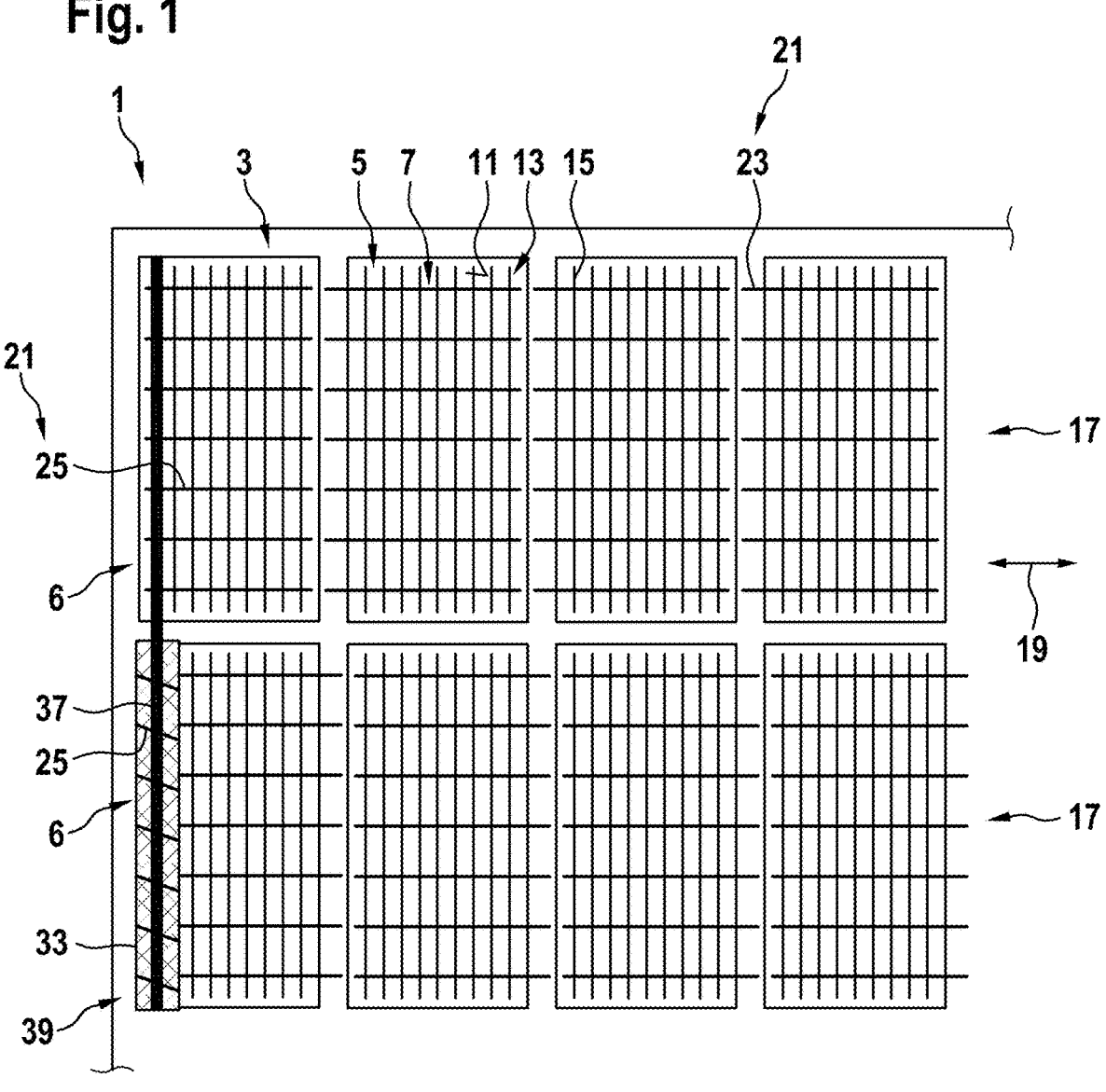
FIG. 1 shows a plan view of a portion of a solar module with a plurality of solar cell arrays according to an embodiment of the invention.
Figure 2:
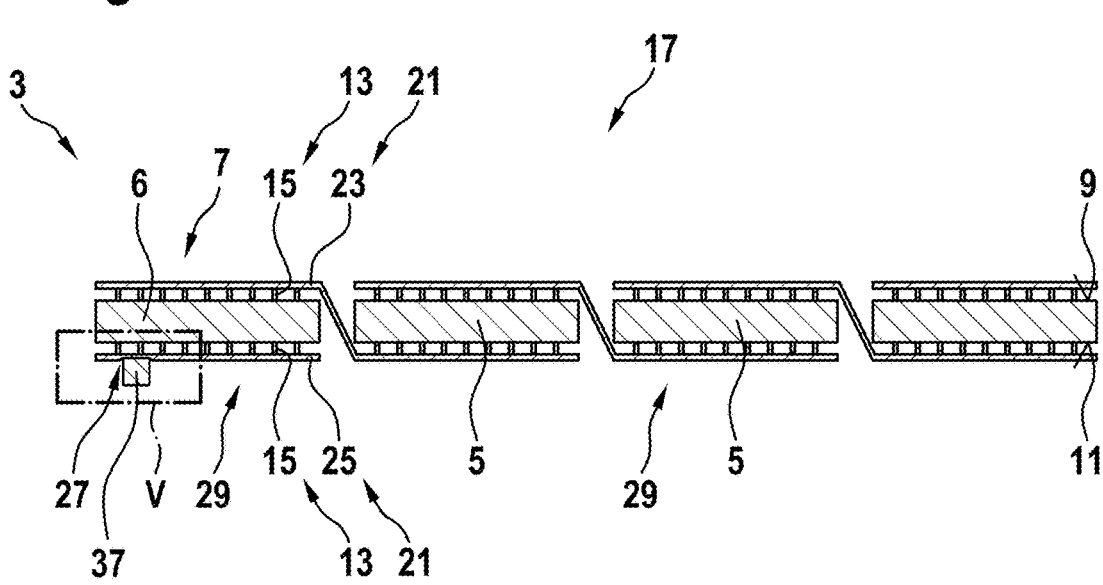
FIG. 2 shows an sectional view along a string through a solar cell array according to an embodiment of the invention.

FIG. 1 shows a rear side plan view of a part of a solar module 1 according to the invention with a plurality of solar cell arrays 3. FIG. 2 shows a sectional view through one of the solar cell arrays 3.

Each solar cell array 3 comprises a plurality of planar solar cell substrates 5 and an interconnection structure 7. In each case, a plurality of solar cell substrates 5 are arranged side by side and interconnected to form strings 17 with the aid of the interconnection structure 7. In the example shown, the solar cell substrates 5 are half-cell substrates based on silicon wafers that have been cut into halves after processing. A length of such half-cell substrates in the longitudinal direction 19 of the string 17 is approximately half their width.

Each of the solar cell substrates 5 has contact structures 13 on both a front contacting surface 9 and a rear contacting surface 11. In the example shown, the contact structures 13 are formed as a grid consisting of a plurality of laterally evenly spaced fine metal fingers 15. In the example shown, the metal fingers 15 extend perpendicularly to the longitudinal direction 19 of the string 17.

The interconnection structure 7 comprises a plurality of wires 21. These wires 21 run substantially parallel to the longitudinal direction 19. Within each string 17, a plurality of wires 21 run parallel to each other and are arranged generally equidistant from each other transversely to the longitudinal direction 19. The wires 21 typically have a significantly larger (for example, about two orders of magnitude) cross-section than the contact structures 13.

Adjacent solar cell substrates 5 are connected to each other with the aid of wires 23 belonging to a first plurality of wires 21. The wires 23 run longitudinally along substantially the entire length of the two adjacent solar cell substrates 5. The wires 23 run across the contact structures 13 on the solar cell substrates 5, thereby connecting the front contacting surface 9 of one of the two solar cell substrates 5 and the rear contacting surface 11 of the other solar cell substrate 5 in series.

Terminal solar cell substrates 6 in one of the strings 17 have only a single solar cell substrate 5 next to them, in contrast to solar cell substrates 5 arranged further inside the string 17. Consequently, the wires 25 of a second plurality of wires 21 on one of the two opposing contacting surfaces 9, 11 serve only to contact and electrically connect contact structures 13 on this terminal solar cell substrate 6, but without these wires 25 extending further to an adjacent solar cell substrate 5.

These wires 25 of the second plurality of wires have a flattened region 27. In this flattened region 27, these wires 25 have a flatter cross-section than the same wires 25 in an adjacent non-flattened region 29 or than non-flattened wires 23 of the first plurality of wires.

Figure 3:
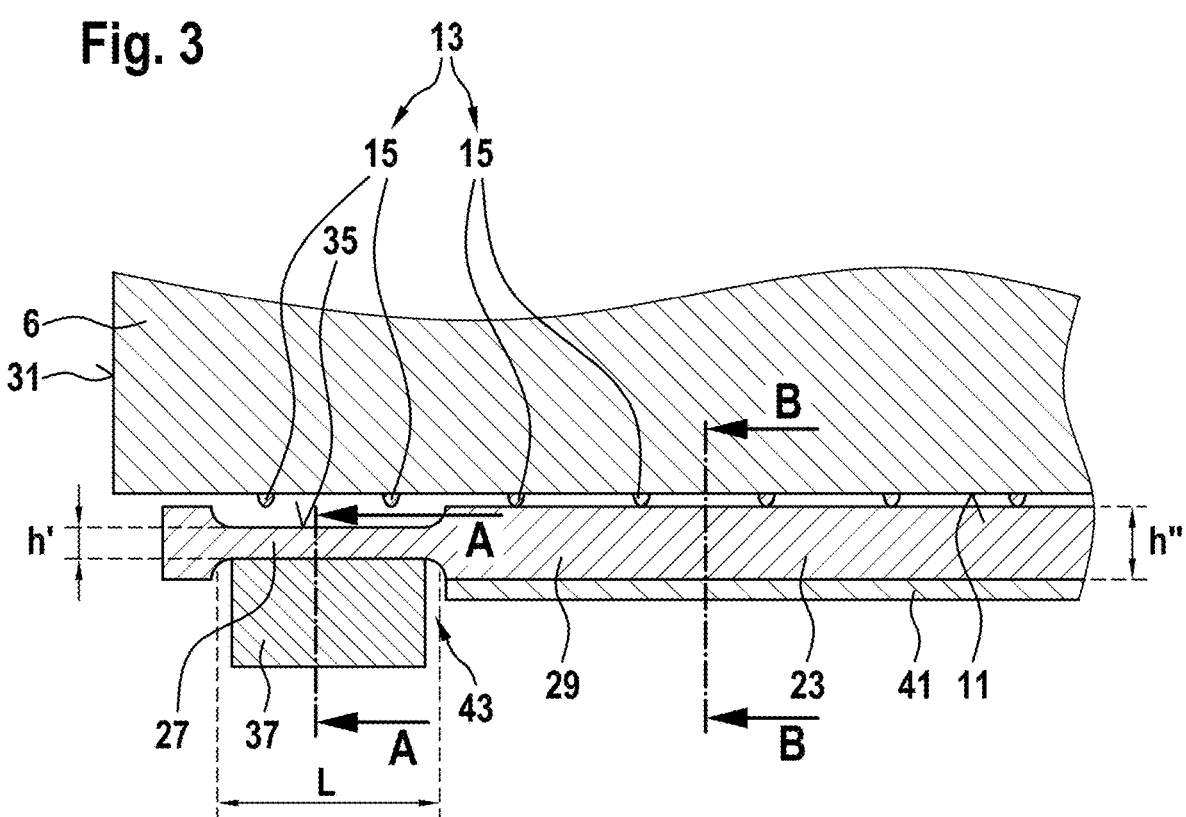
FIG. 3 shows an enlarged view of a region marked V in FIG. 2.
Figure 6A:
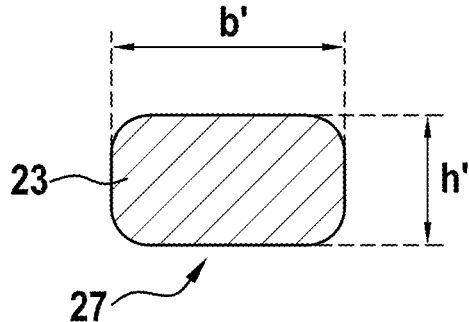
FIG. 6*a* shows a cross-sectional view of wires in flattened regions.
Figure 6B:
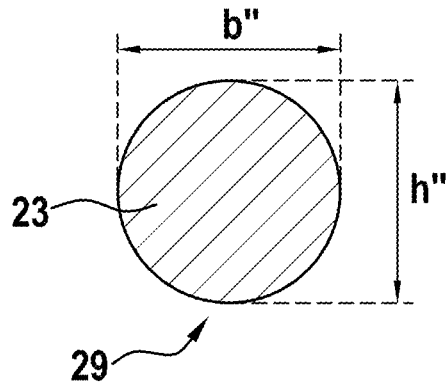
FIG. 6*b* shows a cross-sectional view of wires in non-flattened regions.

FIG. 3 shows an enlarged sectional view of the magnified area V marked in FIG. 2. FIG. 6a illustrates a sectional view through a flattened region 27 along the plane A-A marked in FIG. 3. FIG. 6b illustrates a sectional view through a non-flattened region 29 along the plane B-B marked in FIG. 3.

The flattened region 27 of the wires 25 of the second plurality of wires is located at or near an edge 31 of the terminal solar cell substrate 6 facing away from the solar cell substrate 5 next to this solar cell substrate 6. In other words, the flattened region 27 is disposed at or near an outermost edge of a string 17.

In the flattened region 27, the wire 25, which is originally or otherwise configured as a round wire with a round cross-section, is locally flattened so that a height h' in the flattened region 27 is smaller than a height h" in the non-flattened region 29. The heights h' and h" typically differ by between 10% and 60%, preferably between 20% and 40%. A length L of the flattened region 27 is typically between 6 mm and 20 mm and is at least greater than 3 mm.

Whereas the wire 25 in the non-flattened region 29 preferably has a round cross-section and thus rests with a curved circumferential surface only quasi-linearly against the rear contacting surface 11, the wire 25 in the flattened region 27 has a flat-pressed geometry. In particular, the wire 25 in the flattened region 27 should have a planar surface 35 at least on a side facing towards the solar cell substrate 6. With this flat surface 35, the wire 25 thus adjoins the rear contacting surface 11 and the contact structures 13 provided there in the flattened region 27. The planar surface 35 can lie substantially flat against the contact structures 13.

A cross-connector 37 can interconnect the terminal solar cell substrates 6 of two strings 17 in order to electrically connect adjacent strings 17 of the solar module 1 to one another. In the solar module 1 presented herein, the cross-connector 37 should overlap the second plurality of wires 25 in their flattened regions. In other words, the cross-connector 37 may preferably be arranged perpendicularly to the wires 25 extending in the longitudinal direction 17 and positioned such that the cross-connector 37, as viewed in a direction substantially orthogonal to the rear contacting surface 11, extends adjacently to the flattened region 27 of each of the wires 25.

The cross-connector 37 may apply pressure to the wires 25 towards the solar cell substrate 6. In particular, when encapsulating the solar cell substrates, the circuit structure and the cross-connectors in an encapsulation 39 (only schematically indicated in FIG. 1), significant forces can act on the cross-connector 37.

However, since the cross-connector 37 preferably applies pressure to the wires 25 running between it and the solar cell substrate 6 only in the flattened region 27 and the wires 25 there lie flat against the contacting surface 11 or the contact structures 13, the compressive loads caused in the process can be kept sufficiently low to avoid damage, for example to the solar cell substrate 6.

The cross-connector 37 can thus advantageously, and in particular without the need to reserve surface space for it in the solar module 1, be laid behind the rear side of the terminal solar cell substrate 6 without any significant risk of cracking or fracturing of the solar cell substrates 6 due to local overloads.

Figure 4:
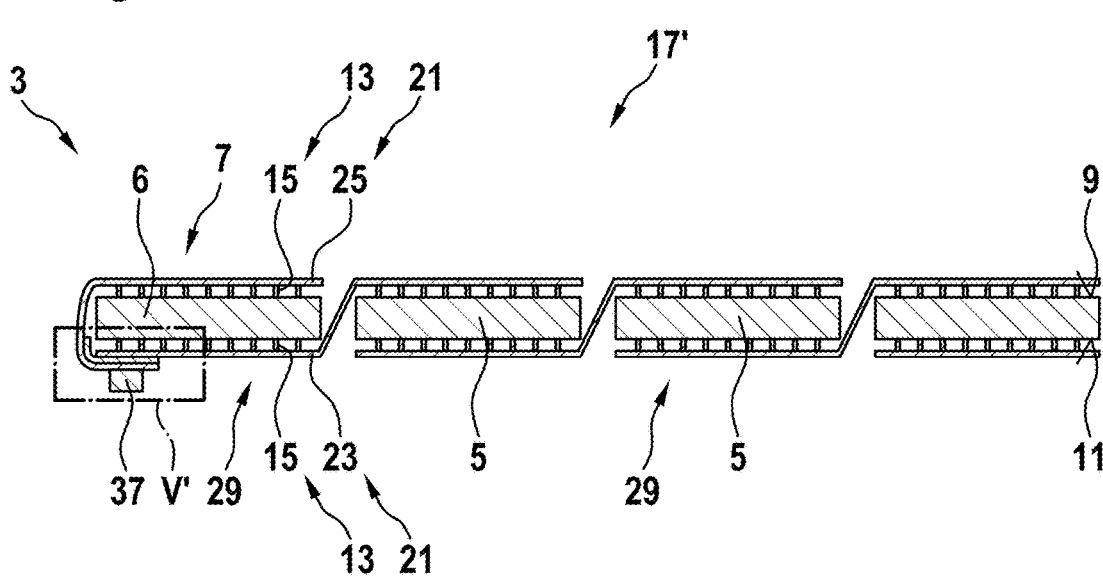
FIG. 4 shows an sectional view along another string through a solar cell array according to an embodiment of the invention.
Figure 5:
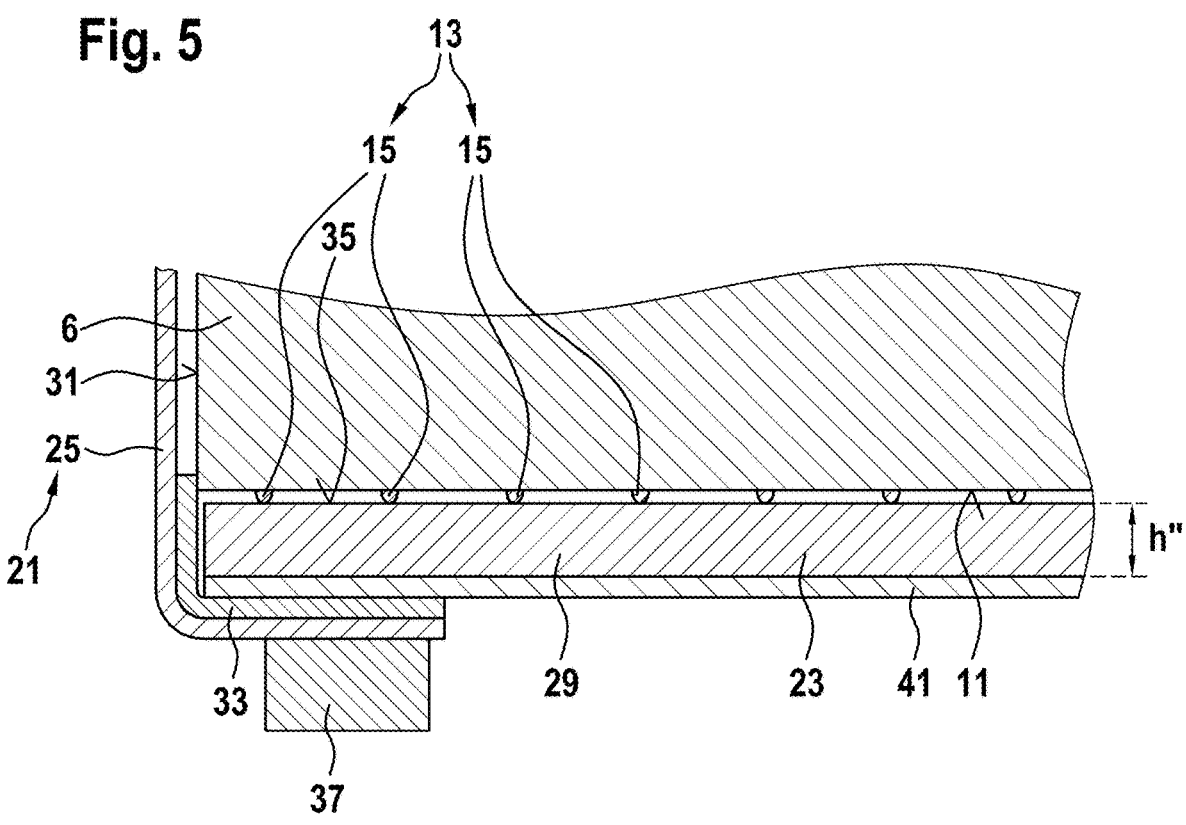
FIG. 5 shows an enlarged view of an area marked V' in FIG. 4.

To connect adjacent strings 17, 17' to each other with a cross-connector 37, the rear contacting surface 11 of the terminal solar cell substrate 6 of one string 17 must be electrically connected to the front contacting surface 9 of the terminal solar cell substrate 6 of the other string 17'. In order to carry out the proposed cross-connection of adjacent strings 17, 17' entirely on the rear side of the strings 17, 17', the plurality of wires 21 of the second string 17' must be routed to the rear side of the second of the terminal solar cell substrates 6 of the second string 17', as shown in FIG. 4 and FIG. 5 as an enlargement of the section V' of FIG. 4. This can be achieved, for example, by making the wires 25 on the front contacting surface 9 of the terminal solar cell substrate 6 of the second string 17' long enough to be bent around the edge 31 of the terminal solar cell substrate 6 of the second string 17' to the rear side of this solar cell substrate 6. An insulation, for example with an insulation film 33 (see FIG. 5 and also FIG. 1), should be interposed between this bent-over plurality of wires 25 and the rear side of the terminal solar cell substrate 6 in order to avoid an electrical short circuit of the terminal solar cell substrate 6 of the second string 17'. Furthermore, the wires 25 bent over from the front side to the rear side of the solar cell substrate 6 may be arranged obliquely and/or offset relative to the wires 25 extending along the rear side (see FIG. 1). The cross-connector 37 may then connect the plurality of wires 25 of the first string 17 along the flattened region 27 to the plurality of wires 25 of the second string 17' lying on the insulating film 33. A flattened region 27 for the wires 25 of the second string 17' may possibly be omitted, since the insulating film 33 can avoid pressure points on the terminal solar cell substrate 6 of the second string 17'.

It is noted that the wires 21 of the interconnection structure 7 may be held by a film 41 which covers the wires 21 on a side opposite to the solar cell substrate 5. With the aid of the film 41, the wires 21 can be held relative to each other, that is to say, for example, fixed so that they run equidistantly from one another. This means that the wires 21 can be easily and precisely arranged along the contacting surfaces 9, 11 of the solar cell substrates 5, 6. The film 41 can if necessary have an opening 43 in an area adjacent to the flattened region 27 of the wires 25 or may be locally removed so that the cross-connector 37 can directly mechanically and electrically contact the wires 25 there.

Finally, it should be noted that terms such as "having", "comprising", etc. do not exclude other elements or steps, and terms such as "one" or "a" do not exclude a plurality. It should further be noted that features or steps that have been described with reference to one of the above embodiments may also be used in combination with other features or steps of other embodiments described above. Reference signs in the claims are not to be considered as limitations.

LIST OF REFERENCES

1 Solar module
3 Solar cell array
5 Solar cell substrate
6 Terminal solar cell substrate
7 Interconnection structure
9 Front contacting surface 11 Rear contacting surface
13 Contact structures
15 Metal fingers
17 String
19 Longitudinal direction
21 Wires
23 Wires of the first plurality of wires
25 Wires of the second plurality of wires
27 Flattened region
29 Non-flattened region
31 Edge of the solar cell substrate
33 Insulating film
35 Planar surface
37 Cross-connector
39 Encapsulation
41 Film
43 Opening

The invention claimed is:

1. A solar module comprising:
a plurality of solar cell arrays,
a cross-connector, and
an encapsulation,
wherein each solar cell array of the plurality of solar cell arrays comprises:
a plurality of planar solar cell substrates, and
an interconnection structure,
wherein each planar solar cell substrate of the plurality of solar cell substrates has contact structures for conducting away current generated in a respective planar solar cell substrate of the plurality of planar solar cell substrates upon illumination of the respective planar solar cell substrate,
wherein the interconnection structure comprises a plurality of wires contacting the contact structures on at least one planar solar cell substrate of the plurality of planar solar cell substrates at contact locations,
wherein a first plurality of wires of the plurality of wires electrically connects respective contact structures on one planar solar cell substrate of the plurality of planar solar cell substrates to contact structures on one neighboring planar solar cell substrate of the plurality of planar solar cell substrates, so that the plurality of solar cell substrates is connected in series to form a string by means of the first plurality of wires,
the first plurality of wires is electrically connected to contact structures on a terminal solar cell substrate of the plurality of planar solar cell substrates which is terminal in the string of the plurality of solar cell substrates connected in series,
wherein a second plurality of wires of the plurality of wires is located only on a surface of the terminal solar cell substrate, and each wire of the second plurality of wires contains both a flattened region and a non-flattened region, the flattened region of each wire of the second plurality of wires has a flatter cross-section than the non-flattened region, the flattened region of each wire of the second plurality of wires has a flatter cross-section than each wire of the first plurality of wires,
wherein the flattened region in each wire of the second plurality of wires is located at or near an edge of the terminal solar cell substrate adjacent to a portion of a contacting surface of a rear side of the terminal solar cell substrate in which contact is made between the rear side of the terminal solar cell substrate and the flattened region in each wire of the second plurality of wires,
wherein the non-flattened region in each wire of the second plurality of wires has a rounded cross-section with a circumferential surface which is curved,
wherein at least two strings, each string formed by means of the first plurality of wires of each solar cell array of the plurality of solar cell arrays, are arranged side by side,
wherein two strings of the at least two strings are interconnected by means of the cross-connector,
and wherein the cross-connector overlaps the second plurality of wires of the respective terminal solar cell substrates of each string of the two strings of solar cell arrays respectively in the flattened region with the cross-connector being arranged in an orthogonal direction to the contacting surface of the rear side of the respective terminal solar cell substrate,
said cross-connector directly contacting the flattened region of each wire of the second plurality of wires of the respective terminal solar cell substrates of each string of the two strings, wherein the encapsulation encapsulates the plurality of solar cell arrays and the cross-connector.

2. The solar module according to claim 1,
wherein the respective terminal solar cell substrate has only one adjacent solar cell substrate in each string of the two strings and wherein the flattened region of each wire of the second plurality of wires of the respective terminal solar cell substrate is disposed respectively on or near an edge of the respective terminal solar cell substrate facing away from an adjacent solar cell substrate.

3. The solar module according to claim 1,
wherein a height of each wire of the second plurality of wires of the respective terminal solar cell substrate in each string of the two strings measured in the orthogonal direction to the contacting surface of the rear side of the respective terminal solar cell substrate is at least 10% smaller in the flattened region than in the non-flattened region of each wire of the second plurality of wires of the respective terminal solar cell substrate in each string of the two strings.

4. The solar module according to claim 1,
wherein the flattened region in each wire of the second plurality of wires of the respective terminal solar cell substrate in each string of the two strings has a planar surface at least on a side facing towards the respective terminal solar cell substrate.

5. The solar module according to claim 1,
wherein a length of the flattened region in each wire of the second plurality of wires of the respective terminal solar cell substrate in each string of the two strings is between 3 mm and 20 mm.

6. The solar module according to claim 1,
wherein each wire of the second plurality of wires of the respective terminal solar cell substrate in each string of the two strings is covered by a film on a side opposite the respective terminal solar cell substrate in areas not directly contacting the cross-connector.

7. The solar module according to claim 1,
wherein the cross-connector mechanically compresses the flattened region of each wire of the second plurality of wires of the respective terminal solar cell substrate in each string of the two strings.

*    *    *    *    *